US011810931B2

(12) United States Patent
Zang et al.

(10) Patent No.: US 11,810,931 B2
(45) Date of Patent: Nov. 7, 2023

(54) PIXEL-ARRAY SUBSTRATE

(71) Applicant: OmniVision Technologies, Inc., Santa Clara, CA (US)

(72) Inventors: Hui Zang, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 335 days.

(21) Appl. No.: 17/220,651

(22) Filed: Apr. 1, 2021

(65) Prior Publication Data
US 2022/0320162 A1    Oct. 6, 2022

(51) Int. Cl.
*H01L 27/146*    (2006.01)
*H04N 25/77*    (2023.01)

(52) U.S. Cl.
CPC .... *H01L 27/14614* (2013.01); *H01L 27/1461* (2013.01); *H01L 27/14603* (2013.01); *H01L 27/14641* (2013.01); *H01L 27/1463* (2013.01); *H04N 25/77* (2023.01)

(58) Field of Classification Search
None
See application file for complete search history.

(56) References Cited

U.S. PATENT DOCUMENTS

2021/0305298 A1*   9/2021   Hu ................... H01L 27/1463
2022/0059587 A1*   2/2022   Zang ............. H01L 27/14612

OTHER PUBLICATIONS

Chakkikavil et al., Structural Optimization of Wavy FinFET for Leakage Reduction and Performance Enhancement, Advances in Science, Technology and Engineering Systems Journal vol. 2, No. 3, 2017, pp. 913-917.

* cited by examiner

*Primary Examiner* — Scott B Geyer
(74) *Attorney, Agent, or Firm* — COZEN O'CONNOR

(57) ABSTRACT

A pixel-array substrate includes (i) a semiconductor substrate including a photodiode region and a floating diffusion region, and (ii) a vertical-transfer-gate structure that includes a trench and a gate electrode. The trench is defined by a bottom surface and a sidewall surface of the substrate each located between a front substrate-surface and a back substrate-surface thereof. The trench extends into the substrate. In a cross-sectional plane perpendicular to the front substrate-surface and intersecting the floating diffusion region, the photodiode region, and the sidewall surface, (a) the trench is located between the floating diffusion region and the photodiode region, and (b) a top section of the sidewall surface is adjacent to the floating diffusion region. A gate electrode partially fills the trench such that the top section and a conductive-surface of the gate electrode in-part define a recess located between the floating diffusion region and the gate electrode.

16 Claims, 8 Drawing Sheets

PIXEL-ARRAY SUBSTRATE

BACKGROUND

Camera modules in commercial products such as stand-alone digital cameras, mobile devices, automotive components, and medical devices include an image sensor and a pixel array thereof. The pixel array includes a plurality of pixels. A pixel array's pixel density is the number of pixels per unit area on the image sensor. In operation, the lens of a camera module forms an image, on the image sensor, of an object in its field of view. The object can be viewed as a plurality of infinitesimally small point-sources of illumination—"impulses"—incident on the camera. The lens images each of the plurality of impulses at a plane of the pixel array as a respective one of a plurality of point-spread functions—"impulse responses." The resolution of images captured by the image sensor depends in part on pixel size compared to the size of the impulse response. Accordingly, one way to increase a camera's maximum attainable resolution is to increase pixel density by decreasing pixel size. Motivation to decrease pixel sizes has led to development of pixels with vertical transfer gates.

Each pixel of the plurality of pixels includes a photodiode, a floating diffusion region, and a transfer gate formed in a pixel-array substrate, which is part of the image sensor. The transfer gate controls electron flow from the photodiode to the floating diffusion region and may be part of a field-effect transistor. Light reaching the photodiode generates photoelectrons. Turning on the transfer gate forms a conducting channel that allows the accumulated photoelectrons to transfer or flow from the photodiode to the floating diffusion region. When the transfer gate is pulsed to an off-state, the associated potential is lower than that of the photodiode raising a barrier in the corresponding energy band diagram to block electron flow from photodiode to floating diffusion region, hence preventing photoelectrons from flowing to the floating diffusion region.

In one common pixel architecture, the photodiode and the floating diffusion region are laterally displaced within the pixel, in a lateral direction parallel to a plane of the pixel array, with the transfer gate therebetween. This plane is horizontally oriented with respect to the vertical direction perpendicular thereto that defines the direction of normally-incident light (illumination) reaching the pixel array. Such a horizontal orientation limits how much the pixel density can be increased. Hence, one way to increase pixel density is to orient the photodiode, transfer gate, and floating diffusion region in a direction that has a vertical component. Such transfer gates are examples of vertical transfer gates.

SUMMARY OF THE EMBODIMENTS

In some imaging scenarios, for example, with low ambient light in all or part of the scene being imaged, production of quality images requires selected image-sensor pixels have a high-conversion gain when capturing the image. Compared to pixels with planar transfer gates, pixels with vertical transfer gates exhibit high parasitic capacitance between the vertical transfer gate and the floating diffusion region. Pixels also exhibit parasitic capacitance between the floating diffusion region and the gate of a source-follower transistor formed in the pixel-array substrate. Each of the parasitic capacitances contribute to the effective capacitance of the floating diffusion region and inhibit high conversion gain for the respective pixels. The parasitic capacitance relates to the connection of the floating diffusion region to transfer gate and the source-follower transistor. The effective capacitance of floating diffusion region is inversely proportional to conversion gain of the respective pixel, the conversion gain being the voltage change in the floating diffusion region when charges are transferred from the photodiode into the floating diffusion region. Embodiments disclosed herein remedy this problem.

In a first aspect, a pixel-array substrate includes (i) a semiconductor substrate including a photodiode region and a floating diffusion region, and (ii) at least one vertical-transfer-gate structure. Each vertical-transfer-gate structure includes a trench and a gate electrode. The trench is defined by a bottom surface and a sidewall surface of the semiconductor substrate each located between a front substrate-surface and a back substrate-surface of the semiconductor substrate. The trench extends into the semiconductor substrate away from a planar region of the front substrate-surface surrounding the trench. In a cross-sectional plane perpendicular to the front substrate-surface and intersecting the floating diffusion region, the photodiode region, and the sidewall surface, (a) the trench is located between the floating diffusion region and the photodiode region, and (b) a top section of the sidewall surface is adjacent to the floating diffusion region. A gate electrode partially fills the trench such that the top section and a conductive-surface of the gate electrode in-part define a recess located between the floating diffusion region and the gate electrode.

In a second aspect, a vertical gate structure includes a semiconductor substrate, a gate electrode, and a low-κ dielectric. The semiconductor substrate includes a bottom surface and a sidewall surface each located between a front substrate-surface and a back substrate-surface of the semiconductor substrate and defining a trench for the vertical gate structure that extends into the semiconductor substrate away from a planar region of the front substrate-surface surrounding the trench. In a cross-sectional plane perpendicular to the front substrate-surface and intersecting a source region of the semiconductor substrate, a drain region of the semiconductor substrate, and the sidewall surface, (a) the trench is located between the drain region and the source region, and (b) a top section of the sidewall surface is adjacent to the drain region. The gate electrode partially fills the trench such that the top section and a conductive-surface of the gate electrode in-part define a recess located between the drain region and the gate electrode. The low-κ dielectric spacer fills the recess.

In a third aspect, a transistor includes a semiconductor substrate including (i) a source region, (ii) a drain region, and (iii) at least one gate structure between the source region and the drain region in a trench-length direction. Each gate structure includes a trench, a first low-κ dielectric spacer, a second low-κ dielectric spacer, and a gate electrode. The trench is defined by a bottom surface and a sidewall surface of the semiconductor substrate each located between a front substrate-surface and a back substrate-surface of the semiconductor substrate. The trench (i) extends into the semiconductor substrate away from a planar region of the front substrate-surface surrounding the trench, and (ii) has, along the trench-length direction, a trench-length between a first and a second sidewall section of the sidewall surface. The first low-κ dielectric spacer is on the first sidewall section adjacent to the source region and has a first thickness in the trench-length direction. A second low-κ dielectric spacer is on the second sidewall section adjacent to the drain region and has a second thickness in the trench-length direction. The trench-length exceeds a sum of the first thickness and the second thickness. The gate electrode formed in the trench between the first low-κ dielectric spacer and second low-κ dielectric spacers.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed of one or more semiconductors such as silicon, silicon-germanium, germanium, gallium arsenide, and other semiconductor materials known to those of skill in the art. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate. It should be noted that element names and symbols may be used interchangeably through this document (e.g., Si vs. silicon); however, both have identical meanings.

Figure 1:
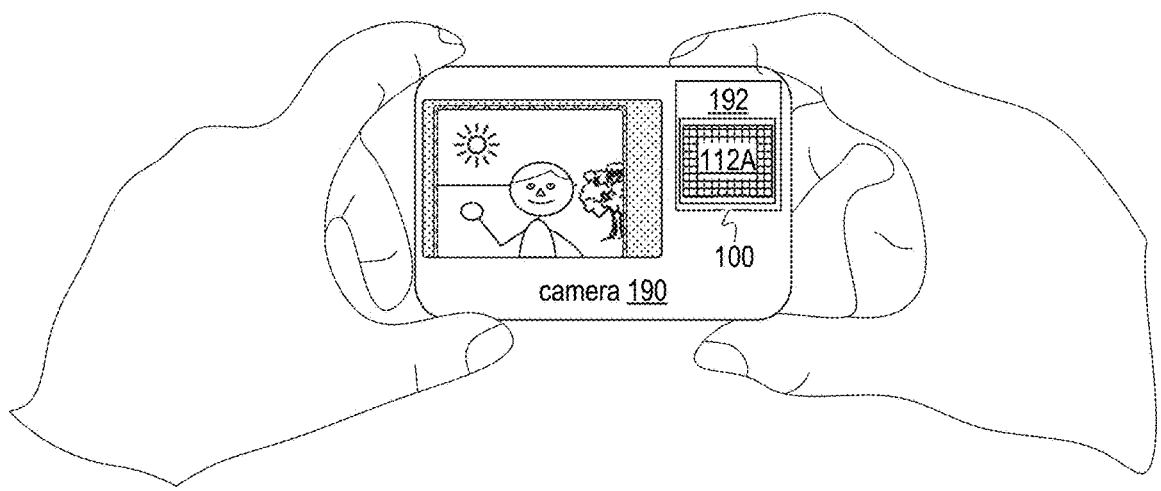
FIG. 1 depicts a camera imaging a scene.

FIG. 1 depicts a camera 190 imaging a scene. Camera 190 includes an image sensor 192, which includes a pixel-array substrate 100. Constituent elements of pixel-array substrate 100 may include at least one of silicon and germanium. Pixel-array substrate 100 includes a pixel array 112A. Image sensor 192 may part of a chip-scale package or a chip-on-board package. Camera 190 is shown as a component of a handheld device, but it should be appreciated that other devices, such as security devices, automobile cameras, drone cameras, etc. may utilize camera 190 without departing from the scope hereof.

Figure 2:
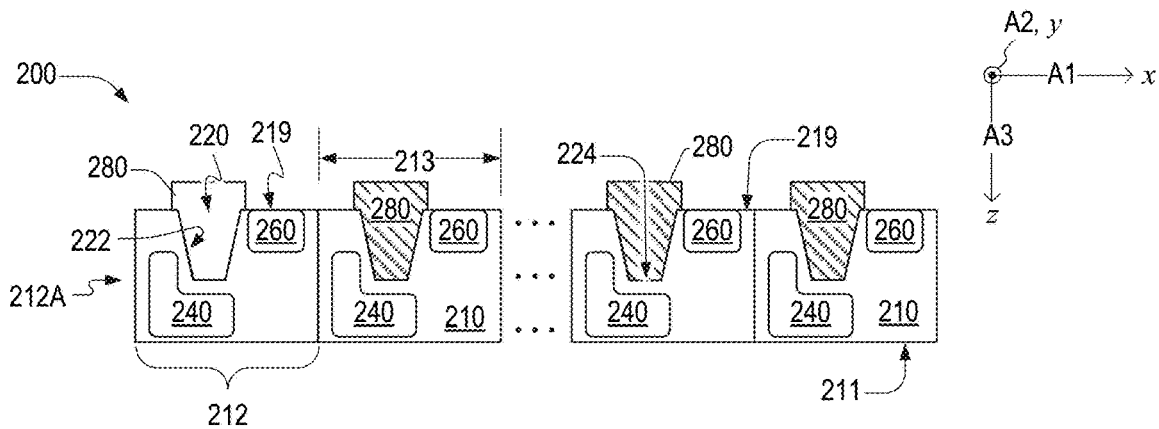
FIG. 2 is a cross-sectional schematic of a pixel-array substrate, which is an embodiment of the pixel-array substrate of the camera of FIG. 1.
Figure 4:
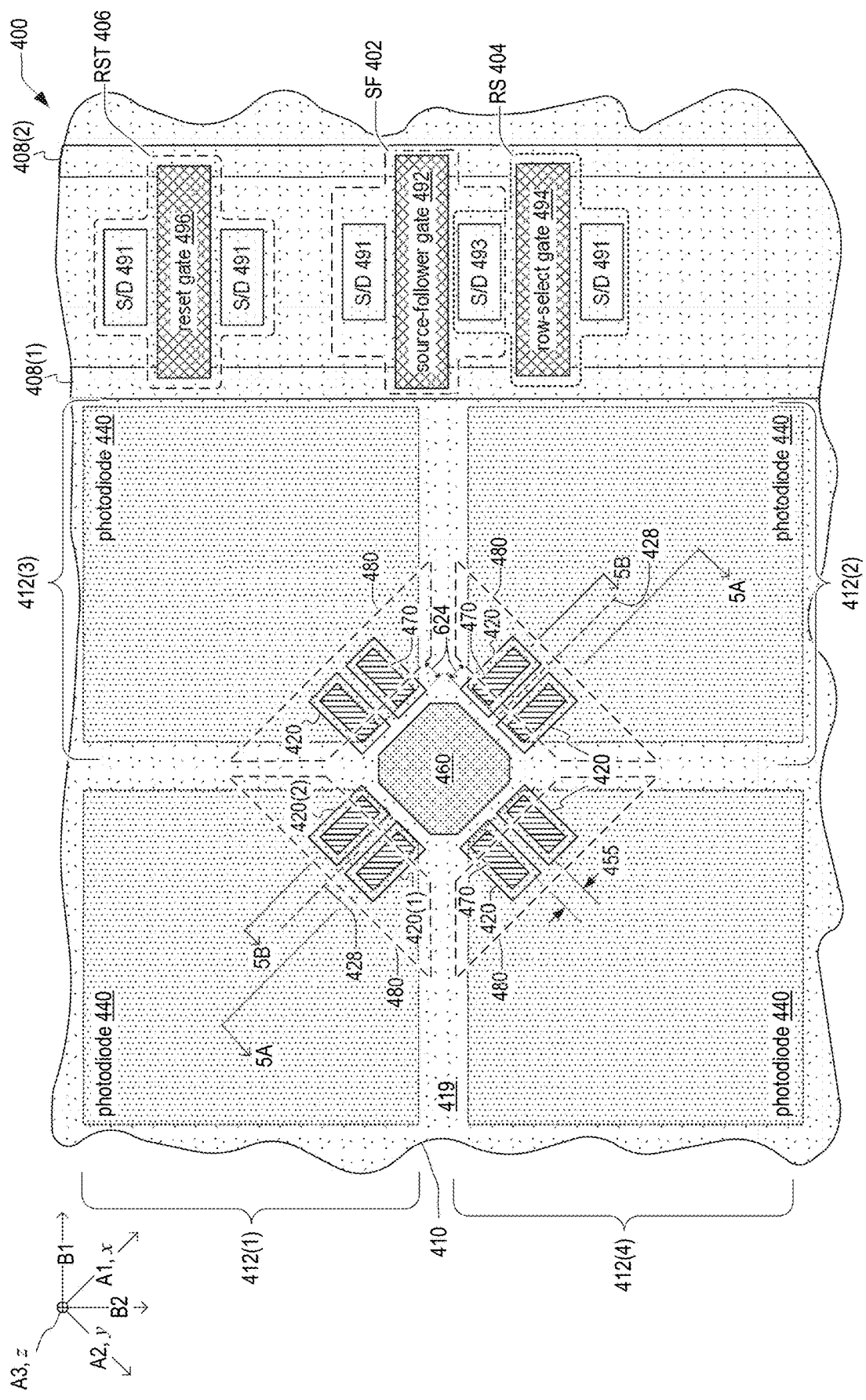
FIG. 4 is a 1 schematic plan view of a high-gain-enabled pixel-array substrate, which is an example of the pixel-array substrate of FIG. 2.

FIG. 2 is a cross-sectional schematic of a pixel-array substrate 200, which is an example of pixel-array substrate 100 of image sensor 192. The cross-section illustrated in FIG. 2 is parallel to a plane, hereinafter the x-z plane, formed by orthogonal axes A1 and A3, which are each orthogonal to an axis A2. Herein, the x-y plane is formed by orthogonal axes A1 and A2, and planes parallel to the x-y plane are referred to as transverse planes. Unless otherwise specified, heights of objects herein refer to the object's extent along axis A3. Herein, a reference to an axis x, y, or z refers to axes A1, A2, and A3 respectively. Also, herein, a horizontal plane is parallel to the x-y plane, a width refers to an object's extent along the x or y axis, and a vertical direction is along the z axis. FIG. 4 also denotes axes B1 and B2, which in embodiments are rotated by forty-five degrees with respect to axes A1 and A2, respectively and denote respective directions of rows and columns of pixels forming a pixel array in semiconductor substrate 410.

Pixel-array substrate 200 includes a semiconductor substrate 210, which has a bottom substrate surface 211 and a front substrate surface 219, each of which may be perpendicular to direction A3. Herein, front substrate surface 219 may be referred to as the front side surface of semiconductor substrate 210 and bottom substrate surface 211 may be referred to as the backside surface of semiconductor substrate 210. Herein, front substrate surface 219 may be referred as the non-illuminated surface of semiconductor substrate 210 and bottom substrate surface 211 opposite to front substrate surface 219 may be referred to as the illuminated surface of semiconductor substrate 210.

Semiconductor substrate 210 includes a plurality of pixels 212 that form a pixel array 212A, which is an example of pixel array 112A. Pixels 212 are arranged in a plurality of rows and columns along axes A1 and A2 respectively. Pixel array 212A has a pixel pitch 213 along axis A1. Along axis A2, pixel array 212A has pitch $P_y$ that, in embodiments, equals pixel pitch 213. In embodiments, pixel pitch 213 is less than 1.6 μm, for example, diagonal pixel pitch 213 may be between 1.0 μm to 3.0 μm, which corresponds to a range of standard pixel pitch between 0.7 μm to 2.0 μm.

Figure 3:
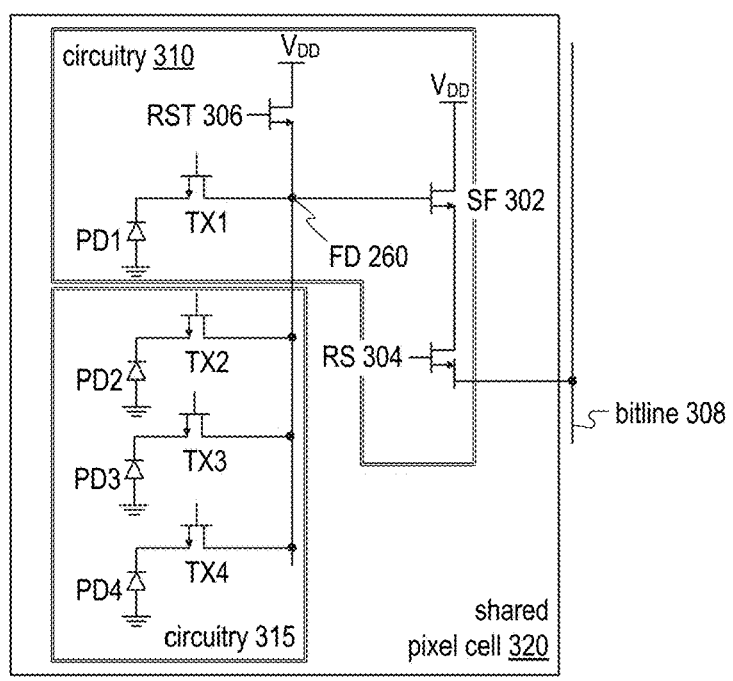
FIG. 3 is a circuit diagram of a shared pixel, which is a candidate pixel circuitry architecture of a pixel of FIG. 2.

FIG. 3 is a circuit diagram of a four-transistor ("4T") circuitry 310, which is a candidate pixel circuitry architecture of pixel 212. Circuitry 310 includes a photodiode PD1, a transfer transistor TX1, a reset transistor 306, a source-follower transistor 302, a row-select transistor RS. Circuitry 310 is electrically connected to a bitline 308 of image sensor 192. FIGS. 2 and 3 are best viewed together in the following description.

In embodiments, each pixel 212 is one of multiple pixels of a shared pixel cell. FIG. 3 depicts a shared pixel-cell 320, which is candidate pixel circuitry architecture for the shared pixel cell. Shared pixel-cell 320 includes circuitry 310 and circuitry 315. Circuitry 315 includes additional respective photodiodes PD2-PD4 and transfer transistors TX2-TX4 of three additional pixels of the shared pixel cell. Circuitry 315 and circuitry 310 represent pixel circuitry for a shared pixel-cell 320. Herein, transfer transistor TX refers to one of transfer transistors T1-T4.

Each pixel 212 includes a respective photodiode 240, a respective transfer transistor (e.g., transfer transistor TX) having vertical transfer gate 280, and a respective floating diffusion region 260. The aforementioned parasitic capacitance occurs at (i) between transfer transistor TX1 and floating diffusion region 260 and (ii) between floating diffusion region 260 and source-follower transistor 302 (e.g., a gate of source-follower transistor 302).

Photodiode 240 of each pixel 212 is at least partially embedded in pixel-array substrate 200 and is configured to generate and accumulate charges in response to incident light (illumination) thereon, for example entered from bottom substrate surface 211 of semiconductor substrate 210 (e.g., backside surface of semiconductor substrate 210) during an integration period of the image sensor 192. Photodiode 240 is an example of any one of photodiodes PD1-PD4 of FIG. 3. In embodiments, photodiode 240 and floating diffusion region 260 are a source and a drain, respectively, of transfer transistor TX.

Electrical connection of photodiode 240 to floating diffusion region 260 depends on voltage applied to a transfer gate (e.g., vertical transfer gate 280) of the respective transfer transistor (e.g., transfer transistor TX) associated with pixel 212. Charges, e.g., photoelectrons, photo-generated and accumulated in photodiode 240 of respective pixel 212 can be selectively transferred to floating diffusion region 260 depending on voltage applied to the transfer gate (e.g., vertical transfer gate 280) of the respective transfer transistor associated with pixel 212, for example during a subsequent charge transfer period. The photodiode 240 may be in form of various configurations including, but not limited to, a pinned photodiode configuration and a partially pinned photodiode configuration. In embodiments, charges accumulate in photodiode 240 during an integration period of image sensor 192.

A transfer gate (e.g., vertical transfer gate 280) of each transfer transistor (e.g., transfer transistor TX1) is formed in a respective trench 220 defined by a side trench-surface 222 and a bottom trench-surface 224 of front substrate surface 219.

In embodiments, each pixel 212 is a pixel unit in a shared pixel cell and each pixel cell further includes reset transistor 306, source-follower transistor 302, and row-select transistor 304 shared by pixel 212 in the shared pixel cell. In FIG. 3, reset transistor 306, source-follower transistor 302, and row-select transistor 304 are abbreviated as RS 306, SF 302, and RST 304, respectively. Reset transistor 306 is coupled between a power line and floating diffusion region 260 to reset (e.g., discharge or charge floating diffusion region 260 to a preset voltage e.g., a supply voltage $V_{DD}$) under control of a reset signal during a reset period. Reset transistor 306 is further coupled to photodiode 240 (e.g., one of photodiodes PD1-PD4) through the respective transfer transistor TX (e.g., transfer transistor TX1-TX4) to reset respective photodiode 240 to the preset voltage during the reset period. Floating diffusion region 260 is coupled to a gate of source-follower transistor 302. Source-follower transistor 302 is coupled between the power line and row-select transistor 304. Source-follower transistor 302 operates to modulate an image signal based on the voltage of floating diffusion region 260, where the image signal corresponds to the amount photoelectrons accumulated in photodiode 240 of each pixel during the integration period at the gate thereof. Row-select transistor 304 selectively couples the output (e.g., image signal) of source-follower transistor 302 to the readout column line (for example, bitline 308) under control of a row select signal.

In operation, during the integration period (also referred to as an exposure or accumulation period) of image sensor 192, photodiode 240 detects or absorbs light incident on pixel 212 and photogenerates charge. During the integration period, each of the transfer transistors TX1-TX4 is turned off, i.e., vertical transfer gate 280 of the respective transfer transistor TX1-TX4 receives a cut-off signal (e.g., a negative biasing voltage). The photogenerated charge accumulated in photodiode 240 is indicative of the amount of light incident on photodiode 240. After the integration period, each of the transfer transistors TX1-TX4 is turned on forming a conduction channel along the vertical transfer gate structure and transfers the photogenerated charge from photodiode 240 to floating diffusion region 260 through the conduction channel upon reception of a transfer signal (e.g., a positive biasing voltage) at vertical transfer gate 280 of transfer transistors TX1-TX4. Source-follower transistor 302 generates the image signal. Row-select transistor 304 coupled to source-follower transistor 302 then selectively reads out the signal onto bitline 308 for subsequent image processing.

In embodiments, vertical transfer gate structures disclosed herein are part of a shared type pixel cell where floating diffusion region 260 is shared by multiple photodiodes. Vertical transfer gate structures disclosed herein may apply to any of a variety of additional or alternative types of pixel cell, e.g. a four-transistor pixel cell, five-transistor pixel cell, or a six-transistor pixel cell.

FIG. 4 is a schematic plan view of a pixel-array substrate 400, which is an example of pixel-array substrate 200, FIG. 2. Pixel-array substrate 400 includes a semiconductor substrate 410 that includes trenches 420, photodiode regions 440, and a floating diffusion region 460, which are examples of semiconductor substrate 210, trenches 220, photodiode regions 240, and floating diffusion region 260, respectively. In embodiments, a respective vertically-oriented gate electrode 470 partially fills each trench 420. For clarity of illustration, not all gate electrodes 470 are labeled with a reference numeral in FIG. 4.

In embodiments, pixel-array substrate 400 includes a plurality of planar gate electrodes 480 electrically each connecting a respective pair of adjacent gate electrodes 470 therebeneath. In embodiments, each planar gate electrode 480 and the vertically-oriented gate electrodes 470 gates therebeneath form a single transfer gate coupling respective photodiode regions 440 to floating diffusion region 460.

In embodiments, pixel-array substrate 400 also includes a source-follower transistor 402, which is an example of source-follower transistor 302. Source-follower transistor 402 includes source/drain regions 491, 493 disposed in pixel-array substrate 400 and a source-follower gate 492 formed on pixel-array substrate 400 and coupled to source/ drain regions 491, 493. Source-follower gate 492 is electrically coupled to floating diffusion region 460. Pixel-array substrate 400 may also include at least one of row-select transistor 404 and a reset transistor 406. Reset transistor 406 includes a pair of source/drain regions 491 disposed in pixel-array substrate 400 and a reset gate 496 formed on pixel-array substrate 400. Reset gate 496 is coupled to the pair of source/drain regions 491 of reset transistor 406. Row-select transistor 404 includes a source/drain region 491 disposed in pixel-array substrate 400, source/drain region 493, and row-select gate 494 coupled to source/drain regions 491, 493. Source/drain region 493 is part of both source-follower transistor 402 and row-select transistor 404 such that the drain of source-follower transistor 402 is the source of row-select transistor 404. Row-select transistor 404 and reset transistors 406 are examples of row-select transistor 304 and reset transistors 306 of FIG. 3, respectively. In embodiments, pixel-array substrate 400 includes shallow-trench isolation (STI) structures 408(1) and 408(2), wherein at least part of each of transistors 402, 404, and 406 is between STI structures 408(1) and 408(2). Each STI structure 408 includes a dielectric material filling a trench formed in front surface 419 of semiconductor substrate 410. In embodiments, a gate width of source follower gate 492 along axis B2 is larger than a gate width of row-select gate 494. In embodiments, a gate length of source follower gate 492 along axis B2 is larger than a gate length of row-select gate 494 along axis B2. In embodiments, a gate width of source follower gate 492 along axis B2 is larger than a gate width of reset gate 496. In embodiments, a gate length of source follower gate 492 along axis B2 is larger than a gate length of reset gate 496 along axis B2. In embodiments, a gate area of source follower gate 492 is larger than a gate area of at least one of row-select gate 494 and reset gate 496 to improve random telegraph noise (RTS) noise performance.

FIG. 4 illustrates transistors 402, 404, and 406 on a same side of floating diffusion region 460 (the right side as FIG. 4 is oriented). Without departing from the scope of the embodiments, transistors 402 and 404 may be on a different side of floating diffusion region 460, e.g., above, below, or the left side, and being similarly oriented and positioned with respect to additional STI structures 408 that are oriented parallel to said different side. For example, pixel-array substrate 400 may include said additional STI structures 408, which in embodiments are oriented parallel to direction B1 and located above or below floating diffusion region 460.

FIG. 4 illustrates a shared pixel cell where multiple photodiodes, e.g., four photodiodes, share a common floating diffusion region, a common source follow transistor, a common reset transistor, and a common row-select transistor. Restated, each of photodiode in the shared pixel cell transfer photo-generated charges to floating diffusion region. In the example of FIG. 4, photodiode regions 440 are the multiple photodiodes and floating diffusion region 460 is the shared floating diffusion region.

Semiconductor substrate 410 has a front surface 419, which is an example of front substrate surface 219. FIG. 4 is shown from the perspective of viewing through front surface 419, where front surface 419 may cover one or more of the components shown in FIG. 4. Trenches 420 include a pair of trenches 420(1) and 420(2) separated by a distance 455 on front surface 419. In embodiments, distance 455 is between 0.03 micrometers and 0.3 micrometers. In embodiments, distance 455 is between 0.12 micrometers to 0.30 micrometers. FIG. 4 denotes a symmetry plane 428 that is perpendicular to the x-y plane and between trenches 420(1) and 420(2). Trenches 420(1) and 420(2) are symmetric with respect to symmetry plane 428.

FIG. 4 denotes a cross-sectional planes 5A and 5B, each of which is parallel to the x-z plane and intersect at least two trenches 420 on opposite sides of floating diffusion region 460. Cross-sectional plane 5A intersects photodiode region 440, floating diffusion region 460, and trench 420(1) therebetween. Cross-sectional plane 5B intersects photodiode region 440, floating diffusion region 460, and trench 420(2) therebetween.

In embodiments, pixel-array substrate 400 includes pixels 412(1-k), where k is a positive integer less than or equal to four. Pixels 412(k) form a two-by-two pixel array. Each pixel 412(k) includes photodiode region 440 and at least one trench 420. Floating diffusion region 460 is common to each of pixels 412(1-4). Pixel 412 is an example of pixel 212, FIG. 2. While FIG. 4 illustrates each pixel 412 with a respective pair of trenches 420, embodiments of pixel-array substrate 400 may include a single trench 420 per pixel 412 without departing from the scope of the embodiments.

Herein, an element in the figures denoted by a reference numeral suffixed by a parenthetical numeral is an example of the element indicated by the reference numeral. Accordingly, and unless otherwise specified, a relationship between two elements with a suffix (m) also applies for those two elements with suffix (n≠m), where m and n are positive integers. While the following description refers to elements with parenthetical numeral (1), it may also apply to at least one of parenthetical numerals (2), (3), and (4). Attributes ascribed to pixel 412(1) or any elements thereof may also be respectively ascribed to one or more pixels 412(2-4) and any elements thereof.

Figure 5:
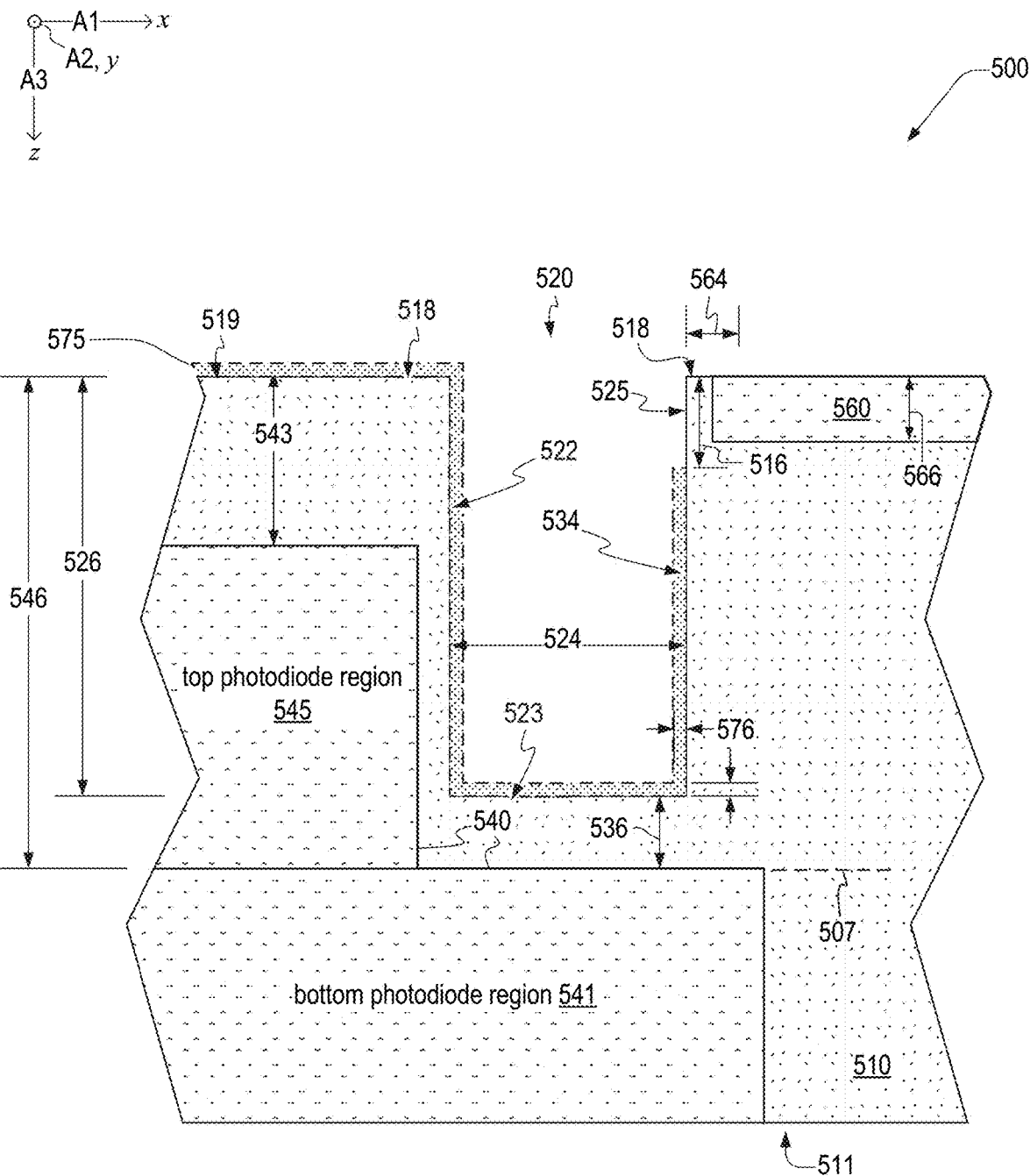
FIG. 5 is a cross-sectional view of a high-gain-enabled pixel-array substrate, which is an example of the pixel-array substrates of FIGS. 2 and 4.

FIG. 5 is a cross-sectional view of a pixel-array substrate 500. Pixel-array substrate 500 includes a semiconductor substrate 510 and, formed therein, a photodiode region 540 and a floating diffusion region 560. Semiconductor substrate 510, photodiode region 540, and floating diffusion region 560 are respective examples of semiconductor substrate 510, photodiode region 440, floating diffusion region 460 of pixel-array substrate 400. Pixel-array substrate 500 is an example of pixel-array substrate 200, FIG. 2, and an example of pixel-array substrate 400. That is, in embodiments, the cross-sectional view of FIG. 5 is part of a cross-sectional view of pixel-array substrate 400 in at least one of cross-sectional planes 5A and 5B.

Semiconductor substrate 510 includes, between a front substrate surface 519 and a back substrate surface 511 thereof, a far-sidewall surface 522, a bottom surface 523, and a near-sidewall surface 534 that define trench 520. Trench 520 extends into semiconductor substrate 510 away from a planar region 518 of front surface 519 surrounding trench 520. Trench 520 is located between floating diffusion region 560 and photodiode region 540. The x-z plane is perpendicular to front surface 519 and intersects floating diffusion region 560, photodiode region 540, and trench 520. In this cross-sectional plane, trench 520 is located between floating diffusion region 560 and photodiode region 540.

Trench 520 has a width 524 between surfaces 522 and 534, and a depth 526 with respect to front surface 519. Width 524 may denote a width of trench 520 in a plane that includes planar region 518. In embodiments, width 524 is between 0.05 micrometers and 0.15 micrometers. In embodiments, depth 526 is between 0.3 micrometers and 0.6 micrometers.

Floating diffusion region 560 is formed at a junction depth 566 with respect to planar region 518. In embodiments, floating diffusion region 560 extends from junction depth 566 to planar surface region 518 thereabove. In embodiments, junction depth 566 is between twenty nanometers and 500 nanometers. Floating diffusion region 560 may extend from junction depth 566 to front surface 519. Alternative, floating diffusion region 560 may extend from junction depth 566 to a depth 565 beneath front surface 519, where depth 565 is between 150 nanometers and 200 nanometers.

Photodiode region 540 is an example of photodiode 240, FIG. 2, and includes a bottom photodiode region 541 beneath trench 520 and a top photodiode region 545 adjacent to trench 520. Bottom photodiode region 541 is formed at a photodiode depth 546 with respect to planar region 518. Bottom photodiode region 541 adjoins top photodiode region 545 at horizontal plane 507 and extends away from planar region 518 toward back substrate surface 511. Horizontal plane 507 is perpendicular to direction A3.

Top photodiode region 545 is formed at a photodiode depth 543, with respect to planar region 518, that is less than trench depth 526 and extends toward back substrate surface 511 to horizontal plane 507. In embodiments, a lateral distance between the top photodiode region 545 and far-sidewall surface 522 is between thirty nanometers and 300 nanometers. This range enables increased efficiency of charge transfer between photodiode region 540 and floating diffusion region 560. Depth 546 exceeds depth 526 by a distance 536, which in embodiments is between thirty nanometers and 300 nanometers.

In embodiments, semiconductor substrate 510 is p-type doped, photodiode region 540 is n-type doped, and floating diffusion region 560 is n$^+$-doped. In embodiments, floating diffusion region 560 has a dopant concentration between $10^{18}$ and $5 \times 10^{20}$ charge carriers per cubic centimeter. In other embodiments, the polarity may be reversed. For example, the semiconductor substrate 510 is n-typed doped, while photodiode region 540 and floating diffusion region 560 are p-type doped.

In embodiments, pixel-array substrate 500 includes a dielectric layer 575 that lines trench 520, for example, by being a conformal layer on far-sidewall surface 522, bottom surface 523, and part of near-sidewall surface 534. Dielectric layer 575 may be formed of an oxide material. Dielectric layer 575 has a thickness 576 which, in embodiments, is between three nanometers and twelve nanometers.

On near-sidewall surface 534, dielectric layer 575 extends from bottom surface 523 to a depth 516 beneath planar region 518. FIG. 5 denotes a top section 525 of near-sidewall surface 534 that is adjacent to floating diffusion region 560 and not covered by dielectric layer 575. In embodiments, depth 516 is between 100 nanometers and 250 nanometers. In embodiments, depth 516 equals junction depth 566 or exceeds junction depth 566 by at most fifty nanometers. For example, depth 516 is between twenty nanometers and 550 nanometers. This range of depth 516 is suitable for adequately reducing parasitic capacitance e.g., junction to gate capacitance between a vertical transfer gate (in trench 520) and floating diffusion region 560. Without departing from the scope of the embodiments, depth 516 may be less than junction depth 566.

FIG. 5 denotes a lateral distance 564 between top section 525 of near-sidewall surface 534 and floating diffusion region 560. In embodiments floating diffusion region 560 extends to top section 525 such that distance 564 equals zero. In embodiments, distance 564 is between zero and forty nanometers.

Figure 6:
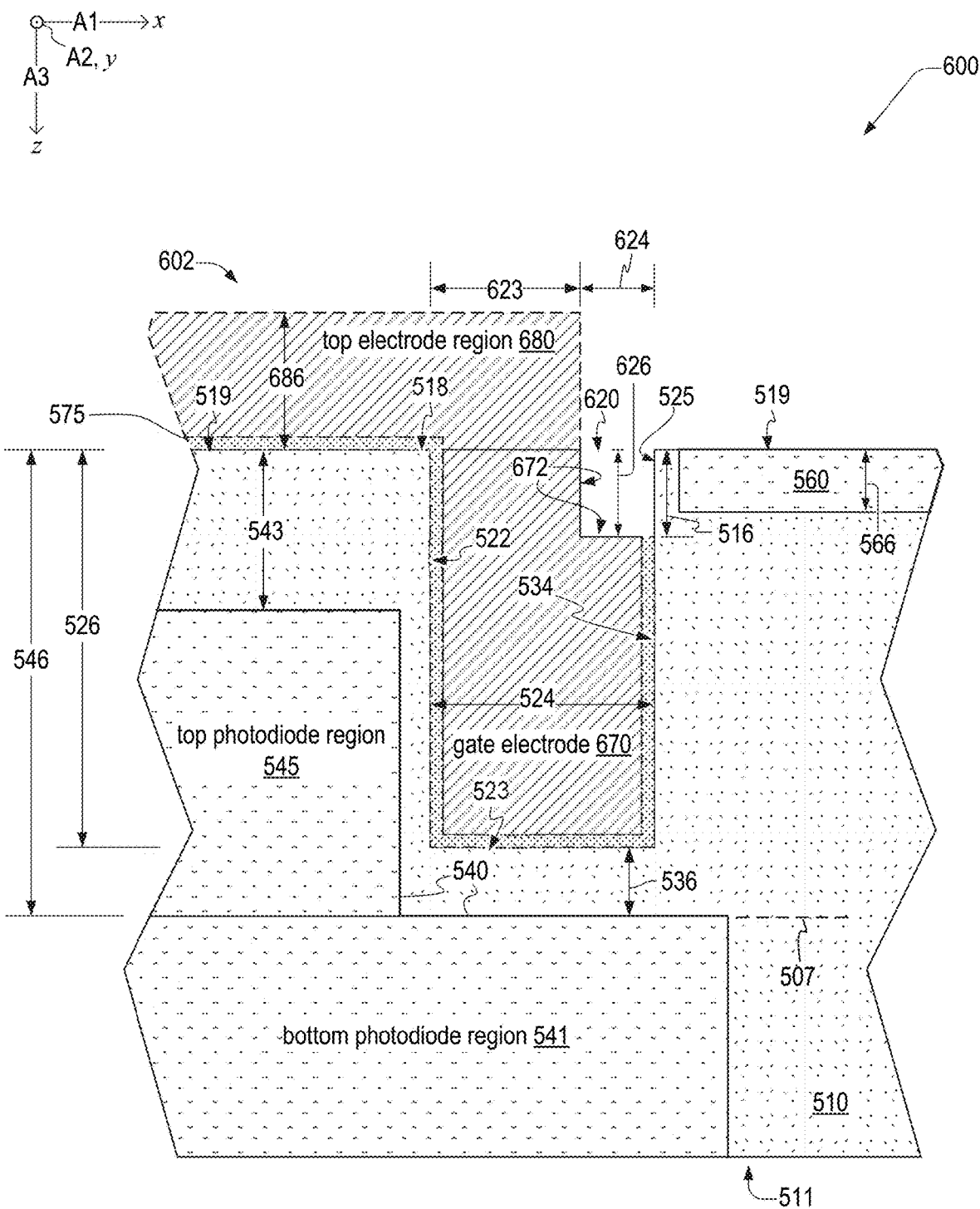
FIG. 6 is a cross-sectional view of the high-gain enabled pixel-array substrate of FIG. 5 with the addition of a gate electrode, in embodiments.

FIG. 6. is a cross-sectional view of a high-gain enabled pixel-array substrate 600, which is pixel-array substrate 500 with the addition of a gate electrode 670 that partially fills trench 520. Gate electrode 670 is an example of gate electrode 470, FIG. 4. Pixel-array substrate 600 is an example of pixel-array substrate 400, FIG. 4. That is, in embodiments, the cross-sectional view of FIG. 6 is part of a cross-sectional view of pixel-array substrate 400 in at least one of cross-sectional planes 5A and 5B.

Gate electrode 670 and trench 520 at least in part constitute a vertical-transfer-gate structure 602 for a transfer transistor (e.g., transfer transistor TX1). In embodiments, vertical-transfer-gate structure 602 includes dielectric layer 575, located between gate-electrode 670 and semiconductor substrate 510, that functions as a gate dielectric.

Gate electrode 670 partially fills trench 520 and includes an electrode surface 672. Top section 525 of near-sidewall surface 534 and electrode surface 672 in-part define a recess 620 located between floating diffusion region 560 and gate electrode 670 of vertical-transfer-gate structure 602. In embodiments, electrode surface 672 includes adjacent surface regions of gate electrode 670, for example, a horizontal surface region and a vertical surface region.

In embodiments, gate electrode 670 includes a planar electrode 680 above a plane that includes front surface 519 and is in part directly above front surface 519. Planar gate electrode 680 is an example of planar gate electrode 480, FIG. 4. Planar electrode 680 may be monolithically formed with gate electrode 670. Planar electrode 680 has a gate-electrode height 686 above planar surface region 518. In embodiments, at least one of gate-electrode 670 and planar electrode 680 are formed of a conductive material such as polysilicon, a metal, or a combination thereof. In embodiments, planar electrode 680 spans between trenches 420(1) and 420(2) on front surface 519 such that planar electrode 680 electrically connects respective gate electrodes 670 in trenches 420(1) and 420(2).

Recess 620 has a recess width 624 and a recess depth 626, which, in embodiments, equals depth 516. In embodiments, recess width 624 is between nine nanometers and thirty nanometers. When recess width 624 is less than nine nanometers, a low-κ dielectric filling recess 620 is insufficiently thick to reduce parasitic capacitance.

An efficient way to fill recess 620 with a low-κ dielectric is to deposit a low-κ dielectric layer on surface 672 and top section 525 of sidewall surface 534. Such deposition may also include depositing the layer on front surface 519. Depositing the low-κ dielectric layer on vertical surfaces, such as surface 672 and top section 525, it is advantageous for recess width 624 to be less than or equal to two times the thickness of the deposited layer, such that said deposition process can completely fill recess 620. For example, when the deposited thickness of the low-κ dielectric layer is fifteen nanometers on vertical surfaces, such as surface 672 and top section 525, it is advantageous for recess width 624 to be less than thirty nanometers such that low-κ dielectric layer deposited can completely fill recess 620.

Determining an advantageous range for recess width 624 involves balancing a tradeoff between recess width 624 and a width 623 of the section of gate electrode 670 that is adjacent to recess 620. In embodiments, the sum of widths 623 and 624 equals trench width 524. In embodiments, recess width 624 is between nine nanometers and twelve nanometers. When recess width 624 is less than or equal to twelve nanometers, width 623 is sufficiently thick to ensure that gate electrode 670 provides sufficient conductivity for vertical-transfer-gate structure 602 to function adequately.

In embodiments, junction depth 566 is less than each of trench depth 526 and photodiode depth 543. In embodiments, recess depth 626 exceeds junction depth 566 by at most fifty nanometers.

Figure 7:
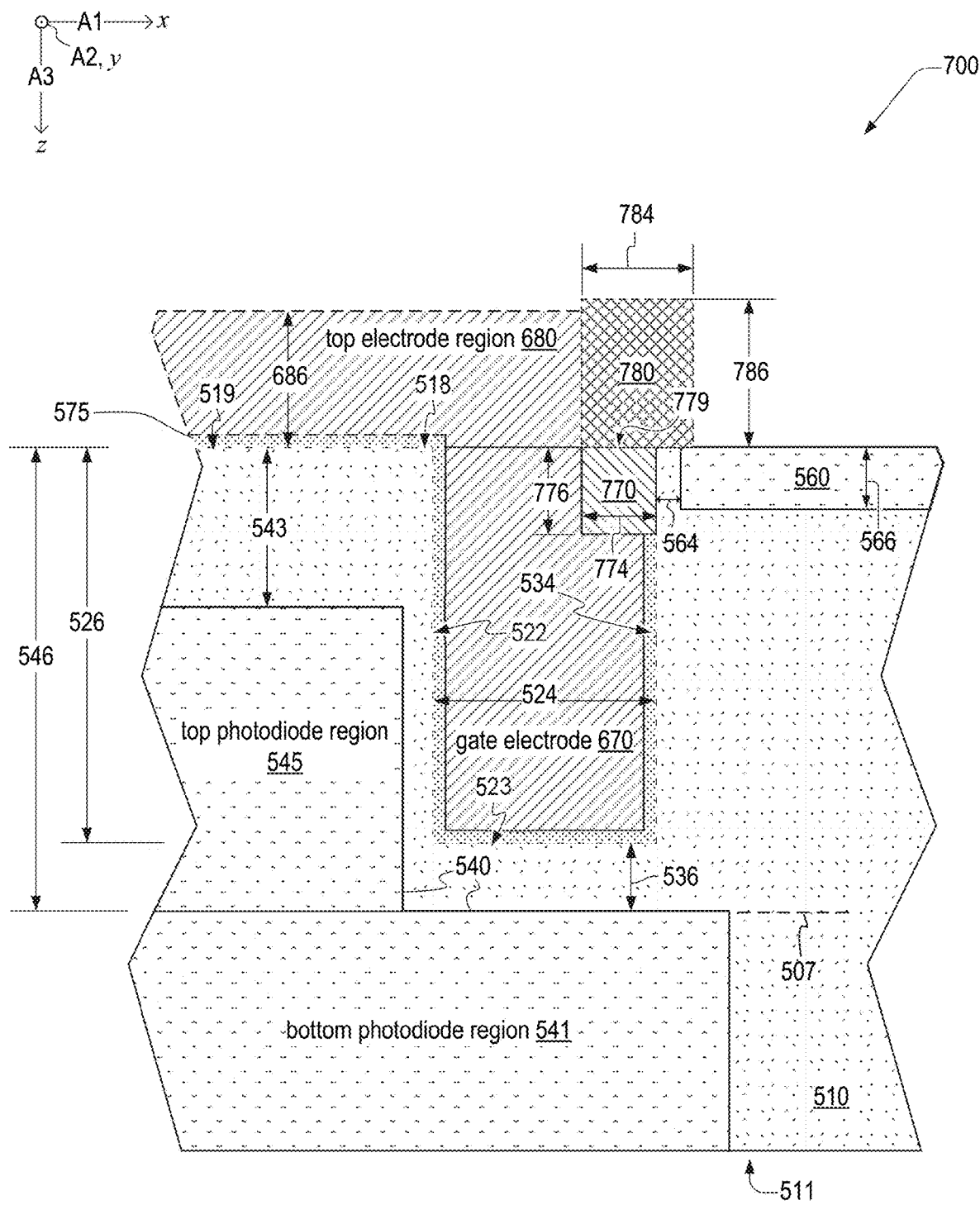
FIG. 7 is a cross-sectional view of the high-gain enabled pixel-array substrate of FIG. 6 with the addition of a low-κ dielectric spacer, in embodiments.

FIG. 7 is a cross-sectional view of a high-gain enabled pixel-array substrate 700, which is pixel-array substrate 600 with the addition of a low-κ dielectric spacer 770 filling recess 620. In embodiments, the cross-sectional view of FIG. 7 is part of a cross-sectional view of pixel-array substrate 400 in at least one of cross-sectional planes 5A and 5B. Low-κ dielectric spacer 770 lowers parasitic capacitance (e.g., junction to gate capacitance) between gate electrode 670 and floating diffusion region 560, reduces the effective capacitance of floating diffusion region 560, and increases the conversion gain associated with floating diffusion region 560. Pixel-array substrate 700 is an example of pixel-array substrate 400, FIG. 4.

Figure 8:
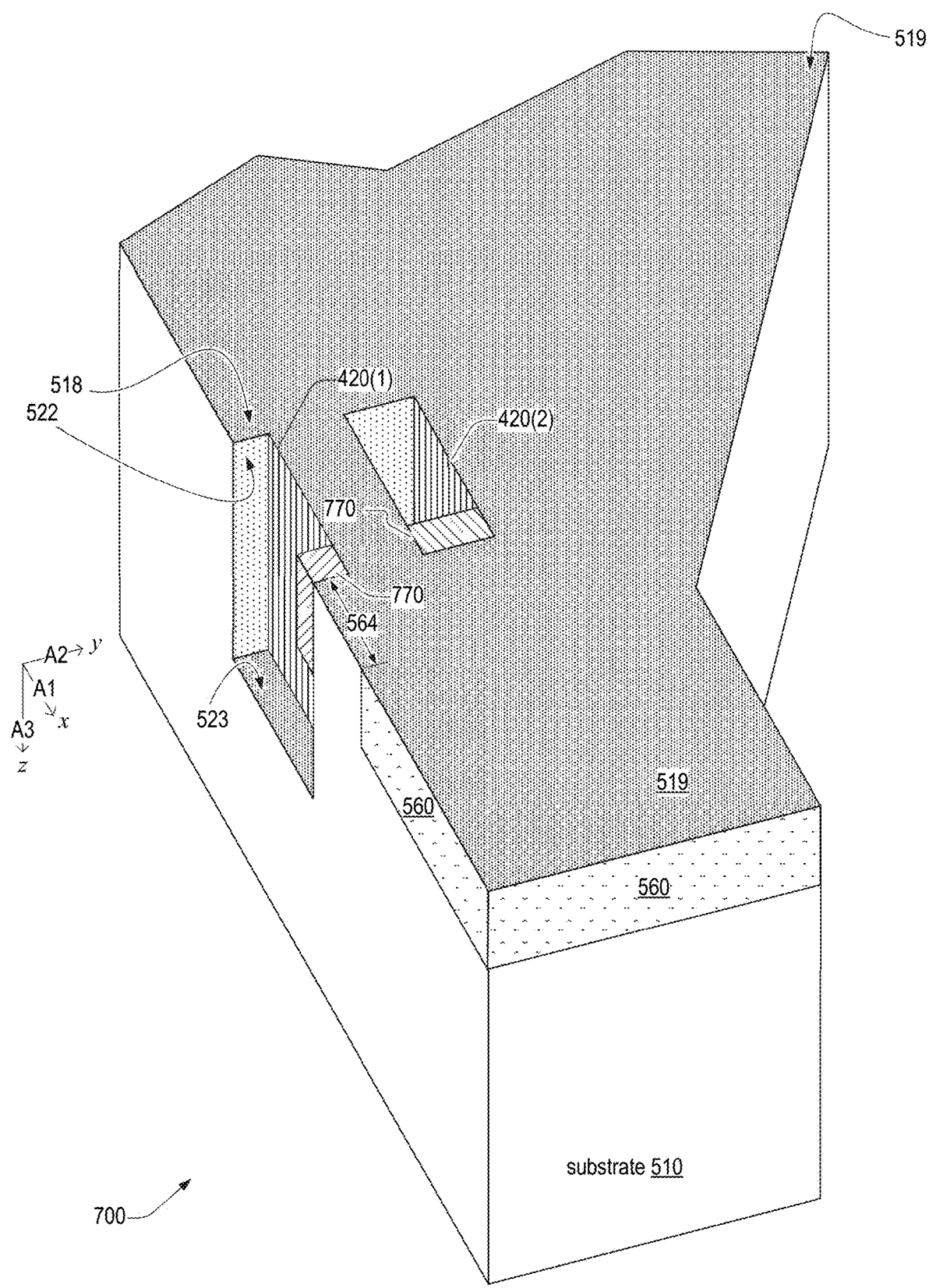
FIG. 8 is an isometric cutaway drawing of pixel-array substrate of FIG. 7, in embodiments.

FIG. 8 is an isometric cutaway drawing of pixel-array substrate 700 that exposes a cross-sectional view of pixel-array substrate 700 in cross-sectional plane 5A. For clarity of illustration, FIG. 8 does not include gate electrode 670 and planar electrode 680. FIGS. 7 and 8 are best viewed together in the following description.

Herein and per convention, a low-κ dielectric is a dielectric material that has dielectric constant κ<3.9, which is the dielectric constant of silicon dioxide. A high-κ dielectric is a dielectric material that has dielectric constant greater than κ>7, which is the dielectric constant of silicon nitride. In embodiments, materials forming low-κ dielectric spacer 770 include at least one of silicon nitricarbide, an oxide, a carbon-doped oxide dielectric. Low-κ dielectric spacer 770 may be porous, such that the ambient gaseous medium filling the pores contributes to lowering the dielectric constant of spacer 770.

Low-κ dielectric spacer 770 has a thickness 774, a height 776, and a top surface 779. Thickness 774 is less than or equal to recess width 624. In embodiments, height 776 equals recess depth 626 such that top surface 779 is coplanar with planar region 518. Thickness 774 denotes a spatial extent of spacer 770 along axis A1.

In embodiments, pixel-array substrate 700 includes an above-substrate spacer 780 disposed on low-κ dielectric spacer 770 and adjacent to top electrode region 680. FIG. 8 does not illustrate above-substrate spacer 780. Above-substrate spacer 780 has a width 784 and a height 786. In embodiments, width 784 is at least one of (i) greater than or equal to thickness 774 and (ii) between ten nanometers in 150 nanometers. Height 786 is greater than or equal to height 686. In embodiments, low-κ dielectric spacer 770 and above-substrate spacer 780 are at least one of (i) formed of the same material, (ii) formed of different materials, and (iii) form a single monolithic spacer. Above-substrate spacer 780 may be formed of a nitride material. In embodiments, pixel-array substrate 700 lacks low-κ dielectric spacer 770 and includes above-substrate spacer 780, such that above-substrate spacer 780 covers recess 620. In embodiments, part of spacer 780 is directly above floating diffusion region 560, as during implantation of floating diffusion region 560, above-substrate spacer 780 may be used a reference for locating the implantation, and the implanted region laterally diffuses beneath above-substrate spacer 780.

Figure 9:
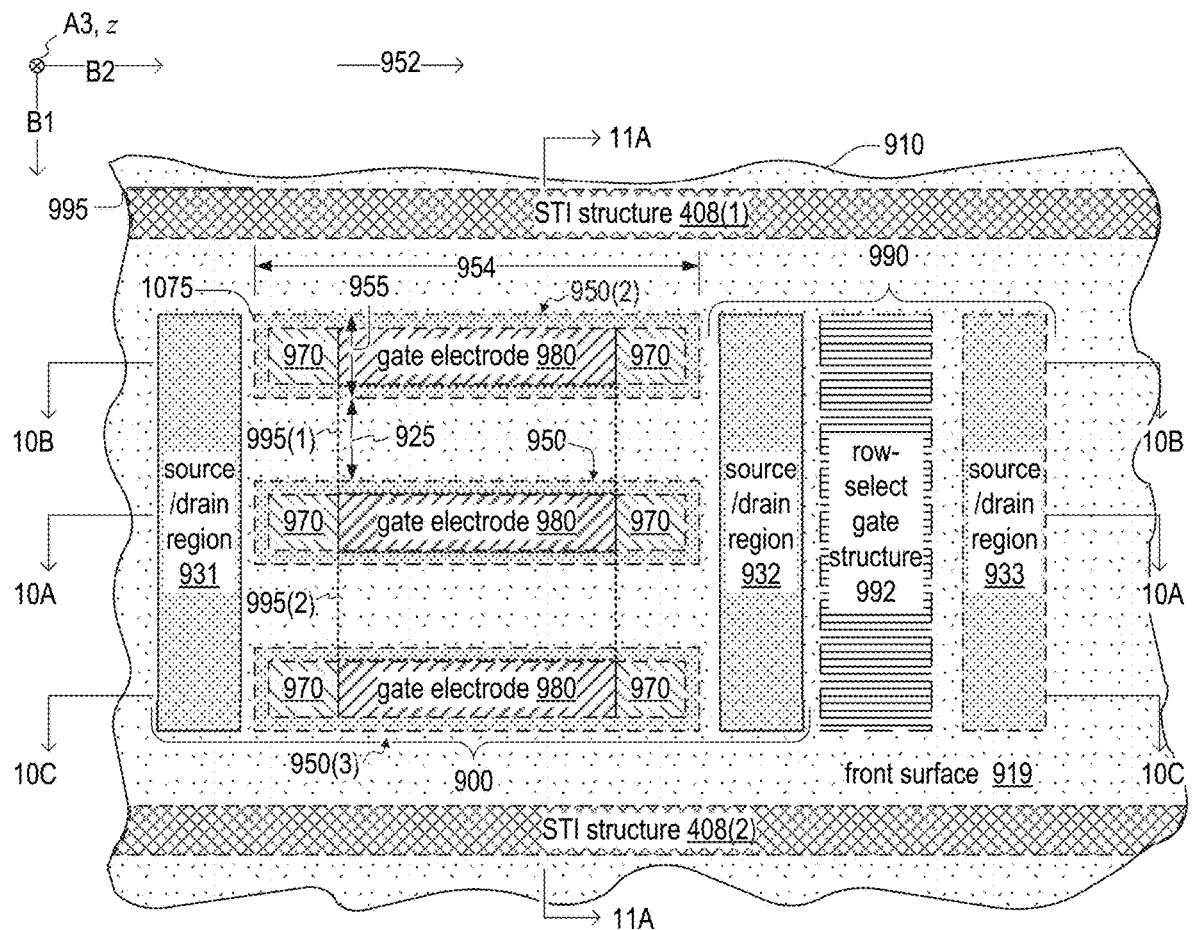
FIGS. 9, 10, and 11 are, respectively, a plan view, a first cross-sectional view, and a second cross-sectional view of a source-follower transistor formed in a semiconductor substrate, in embodiments.
Figure 10:
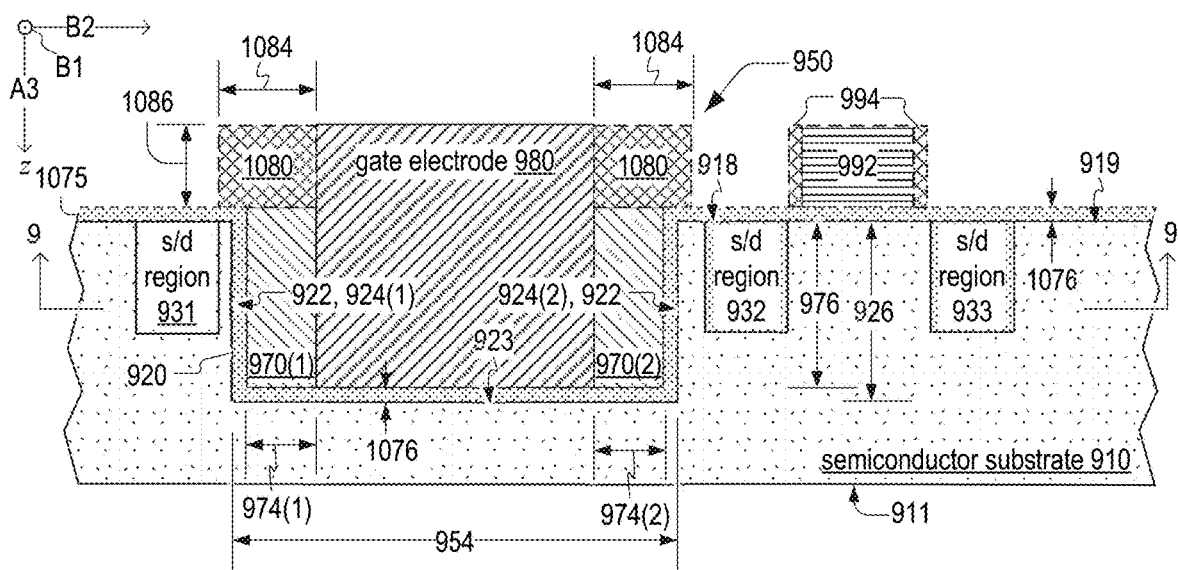
Figure 11:
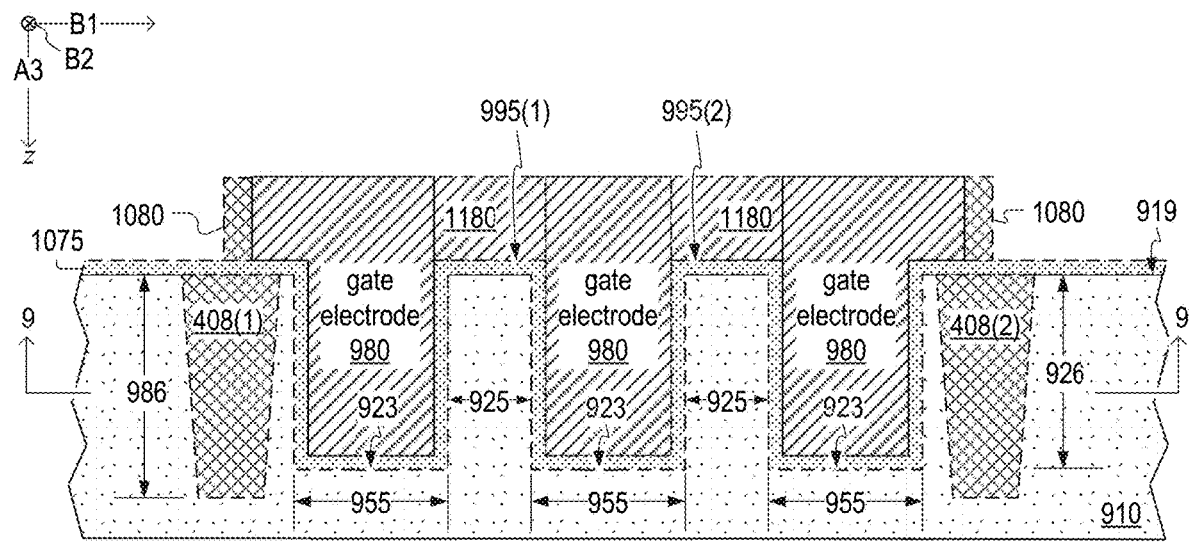

FIGS. 9, 10, and 11 are, respective, cross-sectional views, of a source-follower transistor 900 formed in a semiconductor substrate 910. Source-follower transistor 900 and semiconductor substrate 910 are respective examples of source-follower transistor 402 and semiconductor substrate 410. Source-follower transistor 900 supplements the parasitic capacitance reduction of previously described embodiments by itself including low-κ dielectric spacers adjacent to a gate electrode.

The cross-sectional view of FIG. 9 is in a cross-sectional plane 9 shown in FIGS. 10 and 11. FIG. 9 includes cross-sectional planes 10A, 10B, 10C, and 11A. The cross-sectional view of FIG. 10 is in cross-sectional plane 10A of FIG. 9. In embodiments, the cross-sectional view of FIG. 10 also represents the cross-section of source-follower transistor 900 in at least one of cross-sectional planes 10B and 10C of FIG. 9. The cross-sectional view of FIG. 11 is in cross-sectional plane 11A parallel in a trench-width direction and a channel width direction of source-follower.

Source-follower transistor 900 includes (i) a gate electrode 980, (ii) a source/drain region 931, (iii) a source/drain region 932, and (iv) at least one source-follower gate structure 950 between source/drain region 931 and source/drain region 932 in a trench-length direction 952. In embodiments, source-follower transistor 900 includes additional source-follower gate structures 950, denoted as 950(2) and 950(3) in FIG. 9, which increase the effective channel width of source-follower transistor 900 so as to increase its conduction current, and hence also increase the operation speed of source follower transistor 900. In embodiments, semiconductor substrate 910 includes STI structures 408(1,2), and source-follower transistor 900 is between STI structures 408. In embodiments, source-follower gate structures 950 is electrically connected, in parallel for example, between source/drain regions 931 and 932.

Trench-length direction 952 is parallel to axis B1 and a channel length direction of source-follower. Gate electrode 980 is an example of gate 492, FIG. 4, which is electrically coupled to floating diffusion region 460. Semiconductor substrate 910 is an example of 510, such that, in embodiments, gate electrode 980 is electrically coupled to floating diffusion region 560 of pixel-array substrate 700.

Each source-follower gate structure 950 includes gate electrode 980, a source-follower trench 920 and low-κ dielectric spacers 970(1) and 970(2). At least part of gate electrode 980 is in trench 920. Low-κ dielectric spacers 970 lower parasitic capacitance (e.g., junction to gate capacitance) between (i) gate electrode 980 and source/drain region 931 and (ii) gate electrode 980 and source/drain region 932, and thus can further reduce the overall effective capacitance of floating diffusion region (e.g., floating diffusion region 560) that is coupled to the source-follower gate structure 950. This reduced effective capacitance increases conversion gain and enables capture of images with higher-conversion gain, and hence provides a wider dynamic range in switchable or dual conversion gain imaging applications. FIG. 10 illustrates trench 920 as a thick U-shaped line denoting surfaces of semiconductor substrate 910 that form trench 920.

Figure 12:
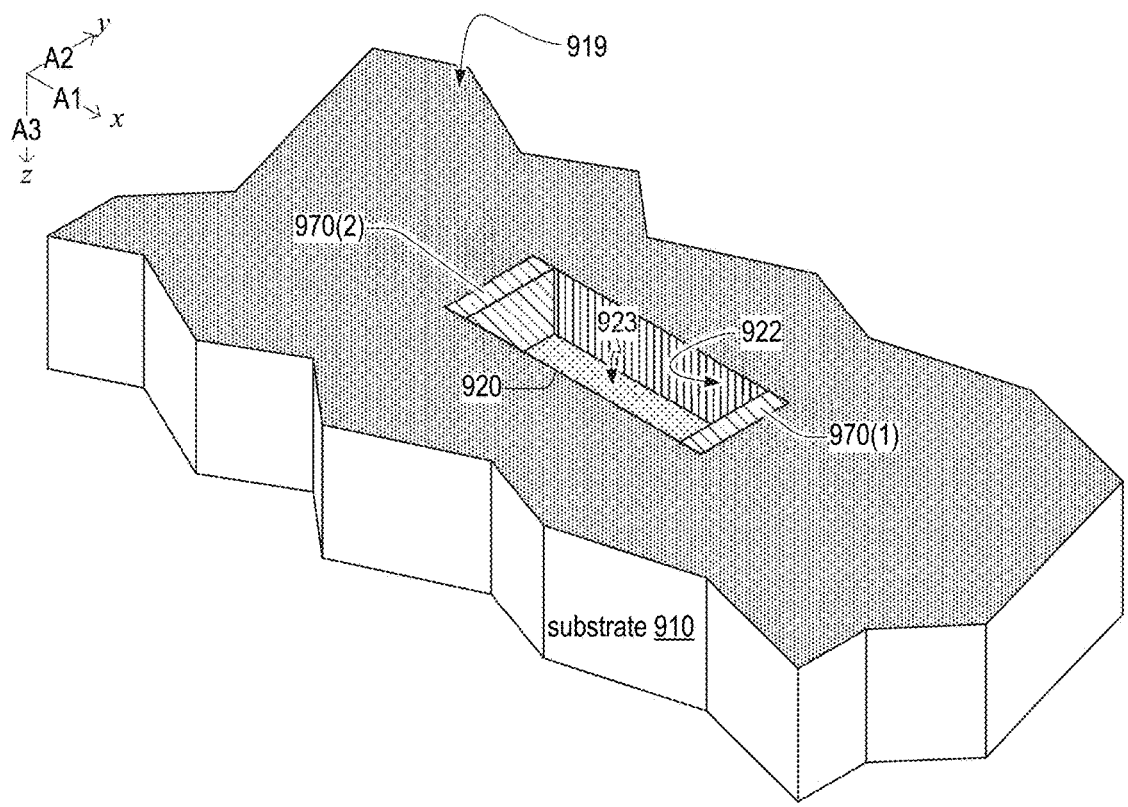
FIG. 12 is an isometric view illustrating part of the source-follower transistor of FIGS. 9-11, in embodiments.

FIG. 12 is an isometric view of source-follower transistor 900 illustrating surfaces 922 and 923 of semiconductor substrate 910 that define a single trench 920. FIGS. 10 and 11 also denote these surfaces. Semiconductor substrate 910 has a front surface 919 and a back surface 911. Source-follower trench 920 is defined by a sidewall surface 922 and a bottom surface 923 of semiconductor substrate 910. Each of surfaces 922 and 923 is located between front surface 919 and back surface 911. Source-follower trench 920 extends into semiconductor substrate 910 away from a planar region 918 of front surface 919 surrounding source-follower trench 920. Along trench-length direction 952, source-follower trench 920 has a trench-length 954 between opposite-facing sidewall sections 924(1) and 924(2) of sidewall surface 922.

Additional source-follower gate structures 950(2) and 950(3) increase the effective channel width, and hence conduction current, of source-follower transistor 900. With respect to planar region 918, source-follower trench 920 has a depth 926 which, in embodiments, is between 225 nanometers and 275 nanometers. In embodiments, depth 926 is between twenty nanometers and six hundred nanometers. When depth 926 is less than twenty nanometers, the increasing of effective channel width of source-follower transistor 900 is too small to effectively improve the device performance e.g., operation speed. Increasing depth 926 to more than 600 nanometers accrues no additional benefit. Along axis B2, trench 920 has a width 955, which in embodiments is between ninety nanometers and 110 nanometers. Adjacent trenches 920 are separated by a distance 925, which in embodiments is between twenty-five nanometers and thirty-five nanometers. In trench 920, low-κ dielectric spacers 970 extend to a depth 976 with respect to planar region 918. Depth 976 exceeds a depth 936 of each of source/drain regions 931-933.

Candidate materials for low-κ dielectric spacers 970 are the same as those for low-κ dielectric spacer 770. Low-κ dielectric spacer 970(1) is on sidewall section 924(1) and has a thickness 974(1) in trench-length direction 952. Low-κ dielectric spacer 970(2) is on sidewall section 924(2) and has a thickness 974(2) in trench-length direction 952. Trench-length 954 exceeds the sum of thicknesses 974(1) and 974(2). In embodiments, thickness 974 is between nine nanometers and thirty nanometers. In embodiments, thickness 974 is between nine nanometers and twelve nanometers.

In embodiments, source-follower transistor 900 includes an above-substrate spacer 1080 on low-κ dielectric spacers 970(1) and 970(2) respectively. In embodiments, above-substrate spacer 1080 formed on front surface 919 abuts the sidewalls of gate electrode 980. Candidate materials for above-substrate spacers 1080 are the same as those for above-substrate spacer 780. Above-substrate spacer 1080 has a width 1084 and a thickness 1086 above front surface 919. In embodiments, width 1084 is at least one of (i) greater than or equal to thickness 974 and (ii) between ten nanometers in 150 nanometers. In embodiments, thickness 1086 is between ten nanometers and 150 nanometers.

When source-follower transistor 900 includes more than one source-follower gate structure 950 to enhance the effective channel width, their respective gate electrodes 980 may be electrically connected to each other by a conductive layer spanning therebetween. In embodiments, source-follower transistor 900 includes, as illustrated in FIG. 11, conductive layers 1180 on front surface 919 that electrically connects each of gate electrodes 980. FIGS. 9 and 11 denote surface regions 995(1) and 995(2) of front surface 919 located between adjacent gate electrodes 980. Conductive layers 1180 are on respective surface regions 995, as illustrated in FIG. 11. In embodiments, surface regions 995 and conductive layers 1180 extend along axis B2 between adjacent low-κ dielectric spacers 970.

In embodiments, substrate 910 includes STI structures 408, part of which may be beneath above-substrate spacer 1080. With respect to front surface 919, STI structures 408 have a depth 986, which in embodiments exceeds depth 926 of each individual source-follower trench 920. In embodiments, each individual source-follower trench 920 is formed parallel to the STI structures 408 (1) and 408(2) in trench-length direction 952. In embodiments, conductive layers 1180 extend along axis B1 and is formed on, e.g., directly on, at least a portion of STI structure 408 (1) and 408(2), for example as illustrated in FIGS. 4 and 11.

In embodiments, source-follower transistor 900 includes a gate-dielectric layer 1075 located on planar region 918. In trench 920, gate-dielectric layer 1075 is located between gate electrode 980 and spacers 970, and between gate electrode 980 and bottom surface 923. Gate-dielectric layer 1075 may be formed of an oxide material. Dielectric layer 1075 has a thickness 1076 which, in embodiments, is between three nanometers and twelve nanometers.

In embodiments, semiconductor substrate 910 includes a row-select gate structure 992 and a source/drain region 933. Source/drain region 932, row-select gate structure 992, and source/drain region 933 function as a row-select transistor 990, which is an example of row-select transistor 404, FIG. 4. In embodiments, row-select gate structure 992 is adjacent to and/or surrounded by a spacer 994, which, like above-substrate spacer 1080, has thickness 1086 above front surface 919.

Combinations of Features

Features described above as well as those claimed below may be combined in various ways without departing from the scope hereof. The following enumerated examples illustrate some possible, non-limiting combinations.

(A1) A pixel-array substrate includes (i) a semiconductor substrate including a photodiode region and a floating diffusion region, and (ii) at least one vertical-transfer-gate structure. Each vertical-transfer-gate structure includes a trench and a gate electrode. The trench is defined by a bottom surface and a sidewall surface of the semiconductor substrate each located between a front substrate-surface and a back substrate-surface of the semiconductor substrate. The trench extends into the semiconductor substrate away from a planar region of the front substrate-surface surrounding the trench. In a cross-sectional plane perpendicular to the front substrate-surface and intersecting the floating diffusion region, the photodiode region, and the sidewall surface, (a) the trench is located between the floating diffusion region and the photodiode region, and (b) a top section of the sidewall surface is adjacent to the floating diffusion region. A gate electrode partially fills the trench such that the top section and a conductive-surface of the gate electrode in-part define a recess located between the floating diffusion region and the gate electrode.

(A2) In embodiments of pixel-array substrate (A1), the at least one vertical-transfer-gate structure includes a first vertical-transfer-gate structure and a second vertical-transfer-gate structure parallel thereto.

(A3) In embodiments of any one of pixel-array substrates (A1) and (A2), in a transverse cross-sectional plane perpendicular to both the cross-sectional plane and the front substrate-surface, the trench has a width between 0.05 micrometers and 0.15 micrometers.

(A4) In embodiments of any one of pixel-array substrates (A1)-(A3), the floating diffusion region extends from the front substrate-surface to a first depth beneath the front substrate-surface. The recess has second depth with respect to a plane coplanar with the front substrate-surface that exceeds the first depth by between zero and fifty nanometers.

(A5) Embodiments of any one of pixel-array substrates (A1)-(A4), further include a dielectric layer lining the trench.

(A6) Embodiments of any one of pixel-array substrates (A1)-(A5), further include a low-κ dielectric spacer filling the recess.

(A7) In embodiments of pixel-array substrate (A6), a top surface of the low-κ dielectric spacer is coplanar with the front substrate-surface.

(A8) In embodiments of any one of pixel-array substrates (A6) and (A7), materials forming the low-κ dielectric spacer includes at least one of silicon nitricarbide, an oxide, and a carbon-doped oxide dielectric.

(A9) In embodiments of any one of pixel-array substrates (A6)-(A8), a thickness of the low-κ dielectric spacer is between nine and thirty nanometers in the cross-sectional plane.

(A10) In embodiments of any one of pixel-array substrates (A6)-(A9), the gate electrode has a gate-electrode height above a plane coplanar with the front substrate-surface, and further includes an above-substrate spacer disposed on the low-κ dielectric spacer. The above-substrate spacer has a height above the plane that is greater than or equal to the gate-electrode height.

(A11) In embodiments of pixel-array substrate (A10), the above-substrate spacer and the low-κ dielectric spacer are formed of a same low-κ dielectric material.

(A12) In embodiments of any one of pixel-array substrates (A10) and (A11), the above-substrate spacer and the low-κ dielectric spacer form a single monolithic spacer.

(A13) Embodiments of any one of pixel-array substrates (A1)-(A12) include a source-transistor formed the semiconductor substrate including (i) a source region, (ii) a drain region, and (iii) at least one gate structure between the source region and the drain region in a trench-length direction. Each gate structure includes a trench, a first low-κ dielectric spacer, a second low-κ dielectric spacer, and a gate electrode. The source-follower trench is defined by a bottom surface and a sidewall surface of the semiconductor substrate each located between a front substrate-surface and a back substrate-surface of the semiconductor substrate. The trench (i) extends into the semiconductor substrate away from a planar region of the front substrate-surface surrounding the trench, and (ii) has, along the trench-length direction, a trench-length between a first and a second sidewall section of the sidewall surface. The first low-κ dielectric spacer is on the first sidewall section and has a first thickness in the trench-length direction. A second low-κ dielectric spacer is on the second sidewall section and has a second thickness in the trench-length direction. The trench-length exceeds a sum of the first thickness and the second thickness. The gate electrode formed in the trench between the first low-κ dielectric spacer and second low-κ dielectric spacers.

(A14) Embodiments of pixel-array substrate (A13) further include a first above-substrate spacer on the first low-κ dielectric spacer; and a second above-substrate spacer on the second low-κ dielectric spacer.

(A15) In embodiments of either one of pixel-array substrates (A13) and (A14), the at least one source-follower gate structure includes a first source-follower gate structure and a second source-follower gate structure electrically connected thereto and, in a direction perpendicular to the trench-length direction adjacent thereto. Respective source-follower trenches of the first and second source-follower gate structures are parallel in the trench-length direction.

(A16) In embodiments of pixel-array substrate (A15), the gate electrode includes a conductive layer filling, and spanning between, the source-follower trench of each of the first and second source-follower gate structures.

(A17) In embodiments of either one of pixel-array substrates (A15) and (A16), the at least one source-follower gate structure further includes a third source-follower gate structure adjacent to the first source-follower gate structure and parallel to each of the first and the second source-follower gate structures.

(A18) In embodiments of any one of pixel-array substrates (A13)-(A17), the gate electrode includes a conductive layer filling the source-follower trench between the first low-κ dielectric spacer and the second low-κ dielectric spacer.

(A19) In embodiments of pixel-array substrate (A18) the conductive layer is also disposed on the front substrate-surface.

(A20) In embodiments of any one of pixel-array substrates (A13)-(A19), each of the thickness of each of the first low-κ dielectric spacer and the second thickness of second low-κ dielectric spacer is between nine and thirty nanometers in the cross-sectional plane.

(A21) In embodiments of pixel-array substrate (A20), a thickness of each of the first low-κ dielectric spacer and the second low-κ dielectric spacer is between nine and twelve nanometers in the cross-sectional plane.

(A22) In embodiments of any one of pixel-array substrates (A13)-(A21), the semiconductor substrate includes a pair of parallel shallow-trench isolation structures formed therein. The source-follower transistor is between the pair of parallel shallow-trench isolation structures.

(B1) A vertical gate structure includes a semiconductor substrate, a gate electrode, and a low-κ dielectric. The semiconductor substrate includes a bottom surface and a sidewall surface each located between a front substrate-surface and a back substrate-surface of the semiconductor substrate and defining a trench extending into the semiconductor substrate away from a planar region of the front substrate-surface surrounding the trench. In a cross-sectional plane perpendicular to the front substrate-surface and intersecting a source region of the semiconductor substrate, a drain region of the semiconductor substrate, and the sidewall surface, (a) the trench is located between the drain region and the source region, and (b) a top section of the sidewall surface is adjacent to the drain region. The gate electrode partially fills the trench such that the top section and a conductive-surface of the gate electrode in-part define a recess located between the drain region and the gate electrode. The low-κ dielectric spacer fills the recess.

(B2) In embodiments of vertical gate structure (B1), a top surface of the low-κ dielectric spacer is coplanar with the front substrate-surface.

(C1) A transistor includes a semiconductor substrate includes (i) a source region, (ii) a drain region, and (iii) at least one gate structure between the source region and the drain region in a trench-length direction. Each gate structure includes a trench, a first low-κ dielectric spacer, a second low-κ dielectric spacer, and a gate electrode. The is trench defined by a bottom surface and a sidewall surface of the semiconductor substrate each located between a front substrate-surface and a back substrate-surface of the semiconductor substrate. The trench (i) extends into the semiconductor substrate away from a planar region of the front substrate-surface surrounding the trench, and (ii) has, along the trench-length direction, a trench-length between a first and a second sidewall section of the sidewall surface. The first low-κ dielectric spacer is on the first sidewall section and has a first thickness in the trench-length direction. A second low-κ dielectric spacer is on the second sidewall section and has a second thickness in the trench-length direction. The trench-length exceeds a sum of the first thickness and the second thickness. The gate electrode formed in the trench between the first low-κ dielectric spacer and second low-κ dielectric spacers.

(C2) In embodiments of transistor (C1), the at least one gate structure includes a first gate structure and a second gate structure adjacent thereto in a direction perpendicular to the trench-length direction. Respective trenches of the first and second gate structures are parallel in the trench-length direction.

(C3) In embodiments of either of transistor (C1) and (C2), the semiconductor substrate includes a pair of parallel shallow-trench isolation structures formed therein. The at least one gate structure is between the pair of parallel shallow-trench isolation structures.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A pixel-array substrate comprising:
   a semiconductor substrate including a photodiode region and a floating diffusion region;
   at least one vertical-transfer-gate structure, each vertical-transfer-gate structure including:
      a trench defined by a bottom surface and a sidewall surface of the semiconductor substrate each located between a front substrate-surface and a back substrate-surface of the semiconductor substrate, the trench extending into the semiconductor substrate away from a planar region of the front substrate-surface surrounding the trench; in a cross-sectional plane perpendicular to the front substrate-surface and intersecting the floating diffusion region, the photodiode region, and the sidewall surface, (a) the trench being located between the floating diffusion region and the photodiode region, and (b) a top section of the sidewall surface being adjacent to the floating diffusion region; and
      a gate electrode partially filling the trench such that the top section and a conductive-surface of the gate electrode in-part define a recess located between the floating diffusion region and the gate electrode.

2. The pixel-array substrate of claim 1, the at least one vertical-transfer-gate structure including a first vertical-transfer-gate structure and a second vertical-transfer-gate structure parallel thereto.

3. The pixel-array substrate of claim 1, in a transverse cross-sectional plane perpendicular to both the cross-sectional plane and the front substrate-surface, the trench having a width between 0.05 micrometers and 0.15 micrometers.

4. The pixel-array substrate of claim 1, the floating diffusion region extending from the front substrate-surface to a first depth beneath the front substrate-surface, the recess having second depth with respect to a plane coplanar with the front substrate-surface that exceeds the first depth by between zero and fifty nanometers.

5. The pixel-array substrate of claim 1, further comprising a low-κ dielectric spacer filling the recess.

6. The pixel-array substrate of claim 5, a top surface of the low-κ dielectric spacer being coplanar with the front substrate-surface.

7. The pixel-array substrate of claim 5, materials forming the low-κ dielectric spacer including at least one of silicon nitricarbide, an oxide, and a carbon-doped oxide dielectric.

8. The pixel-array substrate of claim 5, a thickness of the low-κ dielectric spacer being between nine and thirty nanometers in the cross-sectional plane.

9. The pixel-array substrate of claim 5, the gate electrode having a gate-electrode height above a plane coplanar with the front substrate-surface, and further comprising an above-substrate spacer disposed on the low-κ dielectric spacer, and having a height above the plane that is greater than or equal to the gate-electrode height.

10. The pixel-array substrate of claim 1, further comprising:
   a source-follower transistor formed in the semiconductor substrate and including (i) a gate electrically coupled to the floating diffusion region, (ii) a source region, (iii) a drain region, and (iv) at least one source-follower gate structure between the source region and the drain region in a trench-length direction, each source-follower gate structure including:
      a source-follower trench defined by an additional bottom surface and an additional sidewall surface of the semiconductor substrate each located between the front substrate-surface and the back substrate-surface, the source-follower trench (i) extending into the semiconductor substrate away from an additional planar region of the front substrate-surface surrounding the source-follower trench, and (ii) having, along the trench-length direction, a trench-length between a first and a second sidewall section of the additional sidewall surface;
      a first low-κ dielectric spacer on the first sidewall section and having a first thickness in the trench-length direction;
      a second low-κ dielectric spacer on the second sidewall section and having a second thickness in the trench-length direction, the trench-length exceeding a sum of the first thickness and the second thickness; and
      the gate electrode, at least part of which is between the first and the second low-κ dielectric spacers.

11. The pixel-array substrate of claim 10, the at least one source-follower gate structure including a first source-follower gate structure and a second source-follower gate structure electrically connected thereto and, in a direction perpendicular to the trench-length direction, adjacent thereto, respective source-follower trenches of the first and second source-follower gate structures being parallel in the trench-length direction.

12. The pixel-array substrate of claim 11, the gate electrode including a conductive layer filling, and spanning between, the source-follower trench of each of the first and second source-follower gate structures.

13. The pixel-array substrate of claim 10, the gate electrode including a conductive layer filling the source-follower trench between the first low-κ dielectric spacer and the second low-κ dielectric spacer.

14. The pixel-array substrate of claim 13, the conductive layer also being disposed on the front substrate-surface.

15. The pixel-array substrate of claim 10, each of the first thickness of the first low-κ dielectric spacer and the second thickness of the second low-κ dielectric spacer being between nine and thirty nanometers in the cross-sectional plane.

16. The pixel-array substrate of claim 10, the semiconductor substrate including a pair of parallel shallow-trench isolation structures formed therein, the source-follower transistor being between the pair of parallel shallow-trench isolation structures.

\* \* \* \* \*